(12) United States Patent
Schoenborn

(10) Patent No.: US 6,506,670 B2
(45) Date of Patent: Jan. 14, 2003

(54) SELF ALIGNED GATE

(75) Inventor: Philippe Schoenborn, San Mateo, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/865,900

(22) Filed: May 25, 2001

(65) Prior Publication Data

US 2002/0177280 A1 Nov. 28, 2002

(51) Int. Cl.$^7$ .......................................... H01L 21/3205
(52) U.S. Cl. ........................ 438/592; 438/581; 438/583; 438/655; 438/664; 438/683; 438/299; 438/315
(58) Field of Search ................................ 438/315, 299, 438/592–581, 583, 655, 664, 683

(56) References Cited

U.S. PATENT DOCUMENTS 5,907,436 A * 5/1999 Perry et al. ................. 359/576
6,156,632 A * 12/2000 Schuegraf ................... 438/592

* cited by examiner

Primary Examiner—Matthew Smith
Assistant Examiner—V. Yevsikov
(74) Attorney, Agent, or Firm—Luedeka, Neely & Graham, PC

(57) ABSTRACT

A method for making a gate in an integrated circuit. A gate layer is formed on a substrate, and a blocking layer is formed on the gate layer. The blocking layer is masked with a photoresist layer, and the photoresist layer is developed to define an exposed gate area. The blocking layer is etched in the gate area to expose the gate layer in the gate area, and the photoresist layer is removed. A metal layer is formed on the blocking layer and on the gate layer in the gate area. The metal layer is selectively reacted with the gate layer in the gate area to form a hard mask over the gate layer in the gate area. The metal layer is removed from the blocking layer. The blocking layer is selectively etched without substantially etching the hard mask in the gate area, to expose the gate layer surrounding the gate area. The exposed gate layer is etched to define a gate in the gate area. The hard mask remains on the gate, and functions as an electrical contact to the gate.

18 Claims, 2 Drawing Sheets

| 36 |
| 34 |
| 32 |

Fig. 1  30

| 38 |
| 36 |
| 34 |
| 32 |

Fig. 2  30

| 42 |
| 40 |
| 38 |
| 36 |
| 34 |
| 32 |

Fig. 3  30

| 42 | | 42 |
| 40 | | |
| 38 | | |
| 36 | | |
| 34 | | |
| 32 | | |

Fig. 4  30

| 42 | | 42 |
| 40 | 44 | 40 |
| 38 | | 38 |
| 36 | | |
| 34 | | |
| 32 | | |

| 38 | | 38 |
| 36 | | |
| 34 | | |
| 32 | | |

| 48 | | 48 |
| 38 | | 38 |
| 36 | | |
| 34 | | |
| 32 | | |

| 48 | | 48 |
| 38 | 50 | 38 |
| 36 | | 36 |
| 34 | | |
| 32 | | |

Fig. 8  30

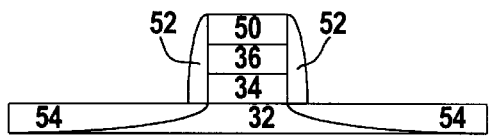
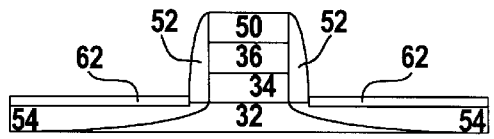

SELF ALIGNED GATE

FIELD

The invention relates generally to the field of integrated circuit fabrication and, in particular, to improved methods for fabricating self aligned transistor gates.

BACKGROUND

The size of integrated circuits continues to decrease while their operation continues to increase in speed and complexity. As the size of integrated circuits decreases, new challenges arise for improved fabrication techniques that provide smaller, more functional circuits without increasing the manufacturing complexity or cost. For example, in a conventional integrated circuit fabrication process for forming a gate structure, the gate is patterned using a photoresist mask to define the gate features. The photoresist mask should be thick enough to protect the gate material, so that the gate material is not completely consumed during the etching process. With ever shrinking integrated circuit geometries, however, the photolithography process tends to require that the photoresist be applied in ever thinner layers, which thinner layers offer less resistance to the etchant, and may thus break down during the etching process and expose the gate material to the etchant.

In the alternative, a hard mask consisting of a relatively thin layer of a material, such as an oxide or a nitride that etches more slowly than the gate material and the photoresist, is used to protect the gate material during the etching process. However, if the top surface of the gate is to be bonded to or further reacted at a later point in time, such as to form a silicide, then the top surface of the gate should be free of any hard mask material that would tend to prevent the silicide from forming. Accordingly, additional steps are typically required to remove the hard mask prior to forming a silicided gate. These additional steps, however, may negatively impact other portions of the overall gate structure, such as a drain spacer or drain liner. Thus, there continues to be a need for techniques which provide improved integrated circuits without significantly increasing manufacturing costs.

SUMMARY

The above and other needs are met by a method for making a gate in an integrated circuit. A gate layer is formed on a substrate, and a blocking layer is formed on the gate layer. The blocking layer is masked with a photoresist layer, and the photoresist layer is developed to define an exposed gate area. The blocking layer is etched in the gate area to expose the gate layer in the gate area, and the photoresist layer is removed. A metal layer is formed on the blocking layer and on the gate layer in the gate area. The metal layer is selectively reacted with the gate layer in the gate area to form a hard mask over the gate layer in the gate area. The metal layer is removed from the blocking layer. The blocking layer is selectively etched without substantially etching the hard mask in the gate area, to expose the gate layer surrounding the gate area. The exposed gate layer is etched to define a gate in the gate area. The hard mask remains on the gate, and functions as an electrical contact to the gate.

Thus the invention provides a means for etching the gate layer to define a gate by using a hard mask to protect the gate during the etch instead of using photoresist. In addition, the hard mask is preferably a reacted metal layer that remains on the gate as an electrical contact, and thus does not need to be removed in an additional later step in the process. Therefore, the invention reduces the complexity and steps necessary to remove a hard mask material when forming a gate.

In various preferred embodiments of the invention, an anti-reflective layer is formed on the blocking layer prior to masking the blocking layer with the photoresist layer. The gate layer preferably comprises polysilicon, and the metal layer preferably comprises at least one of titanium, tungsten, nickel and cobalt, and most preferably cobalt. Thus, the hard mask is preferably a silicide, and most preferably cobalt silicide. The substrate is preferably a gate dielectric layer on top of a semiconducting substrate, which is most preferably silicon.

In a most preferred embodiment, the step of masking the blocking layer with a photoresist layer comprises masking the blocking layer with a negative photoresist layer, and exposing the negative photoresist layer using a positive photoresist mask. The positive photoresist mask is one such as typically is used to expose a positive photoresist layer prior to a gate etch process. Thus, a new mask does not need to be made in order to accomplish the processing described herein.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross sectional side view of a substrate having a gate insulation layer and a gate layer, FIG. 2 is a cross sectional side view of the substrate having a blocking layer, FIG. 3 is a cross sectional side view of the substrate having an anti-reflective layer and a photoresist layer, FIG. 4 is a cross sectional side view of the substrate with the photoresist layer exposed and patterned, FIG. 5 is a cross sectional side view of the substrate with the anti-reflective layer and blocking layer etched, FIG. 6 is a cross sectional side view of the substrate with the photoresist layer and anti-reflective layer stripped, FIG. 7 is a cross sectional side view of the substrate having a metal layer, FIG. 8 is a cross sectional side view of the substrate with the metal layer and the gate layer forming a silicide hard mask and gate contact in the gate area, FIG. 9 is a cross sectional side view of the substrate with the unreacted metal layer stripped, FIG. 10 is a cross sectional side view of the substrate with the blocking layer stripped, FIG. 11 is a cross sectional side view of the substrate with the gate layer etched under the hard mask, FIG. 12 is a cross sectional side view of the substrate having source drain areas and gate spacers, and FIG. 13 is a cross sectional side view of the substrate having salicided contacts.

DETAILED DESCRIPTION

With reference now to FIG. 1, a substrate 30 is depicted, including a support material 32, preferably of a semiconducting material such as silicon, germanium, or gallium arsenide, an insulating layer 34, such as an oxide, and a gate layer 36, such as polysilicon. The insulating layer 34 is preferably a gate oxide layer which is grown over the surface of the support material 32, such as by a thermal oxidation process. The oxide layer 34 preferably has a thickness ranging from about ten angstroms to about one hundred angstroms or more, and most preferably about twenty angstroms. The gate layer 36 is preferably polysilicon or germanium-based semiconductor material which is deposited by low pressure chemical vapor deposition to a thickness ranging from about five hundred angstroms to about twenty-five hundred angstroms or more. A preferred thickness for the gate layer 36 is about fifteen hundred angstroms. While the preferred gate layer 36 is described as a polysilicon or germanium-based semiconductor material, the invention may also be applicable to other semiconductor materials that are compatible with the materials, functions and processes described herein.

A blocking layer 38 is applied to the gate layer 36 on the substrate 30, as depicted in FIG. 2. The blocking layer 38 is preferably a dielectric material that is formed by oxidizing the surface of gate layer 36 or depositing a low temperature oxide or nitrided dielectric materials such as silicon nitride or silicon oxynitride on the surface of the gate layer 36. The blocking layer 38 preferably has a thickness ranging from about twenty angstroms to about two hundred angstroms, and most preferably about fifty angstroms. An anti-reflective layer 40 may optionally be applied to the blocking layer 38 prior to coating the substrate 30 with photoresist 42, as illustrated by FIG. 3.

As depicted in FIG. 4, the photoresist 42 is masked and developed to define the gate area 44. In a most preferred embodiment, the photoresist 42 is a negative photoresist that is exposed using a standard positive mask that is typically used to expose a positive photoresist when etching a gate in the gate layer 36. By using a negative photoresist with the positive photoresist mask, the same mask that was previously used to expose the gate formation photoresist layer according to a standard process can be used with the new process according to the present invention. This preferably eliminates the need to create a new mask for the process as described herein.

Alternately, the standard mask may be configured to work with a negative photoresist when defining the gate masking photoresist layer. In this case, the photoresist layer 42 of the present invention is preferably a positive photoresist. Thus, according to the invention, the opposite type of photoresist is used, so that the substrate 30 is patterned in a manner that is opposite of the standard processing, even though the same mask is used as was created for the standard processing. However, in further alternate embodiments, a new mask is created to function according to the method as described herein, using whatever type of photoresist is desired.

The underlying anti-reflective layer 40, if present, and the blocking layer 38 are removed in the gate area 44 by etching, such as by using a plasma etching process in the presence of trifluoromethane, carbon tetra fluoride and oxygen, a combination of such, or other conventional plasma etching gases effective to remove the anti-reflective layer 40 and blocking layer 38 in the gate area 44, as depicted in FIG. 5. It is preferred that the plasma etching process for removing the blocking layer 38 be selective to the underlying gate layer 36, so that the gate layer 36 is not etched and removed with the anti-reflective layer 40 and the blocking layer 38. It is preferred that less than about fifty angstroms of the gate layer 36 be removed in the etching process whereby the blocking layer 38 and anti-reflective layer 40 are removed from the gate area 44.

The photoresist layer 42 and the anti-reflective layer 40 are removed from the substrate 30 as shown in FIG. 6. The photoresist layer 42 is preferably removed from the substrate 30 by a conventional photoresist stripping process such as by ashing in a plasma asher or acid stripping. The anti-reflective layer 40 is preferably removed by a process that does not significantly attack or otherwise thin the blocking layer 38 beneath it.

The gate material 46 that is exposed in the gate area 44 is preferably silicided to create an electrical contact for the semiconductor gate that is to be formed as described below. As also described in more detail below, the silicided electrical contact formed in the gate area 44 also acts as a hard mask for etching the semiconductor gate.

The exposed gate material 46 in the gate area 44 is preferably surface cleaned, such as with hydrofluoric acid, and a refractory metal layer 48 is formed over at least the gate area 44, as depicted in FIG. 7. The metal layer 48 is preferably formed of a metal selected from the group consisting of titanium, tungsten, nickel, cobalt or any other metallic material that is compatible with the materials, functions and process described herein. The refractory metal layer 48 may be applied to the exposed gate material 46 such as by sputtering or chemical vapor deposition. After depositing the refractory metal layer 48 on the substrate 30, the layer 48 is annealed to react the metal layer 48 with the exposed gate material 46 in the gate layer 36 to form a metal silicide 50 in the gate area 44, as depicted in FIG. 8. Metal silicides which may be formed according to the invention when the gate layer 36 is polysilicon include, but are not limited to tungsten silicide, titanium silicide, nickel silicide and cobalt silicide. In a particularly preferred embodiment of the invention, gate material 46 is polysilicon, the refractory metal layer 48 is cobalt, and the metal silicide 50 is cobalt silicide.

After forming the metal silicide 50 in the gate area 44, the unreacted refractory metal in refractory metal layer 48 is stripped from the surface of the blocking layer 38, such as by an acid strip process. Sulfuric acid is a preferred acid for use in removing the unreacted metal refractory in layer 48. The substrate 30 contains the exposed metal silicide 50 in the gate area 44, surrounded by the blocking layer 38, as shown in FIG. 9.

The blocking layer 38 is removed from the surface of the gate layer 36 surrounding the metal silicide 50 to provide an exposed gate layer 36 as shown in FIG. 10. The blocking layer 38 may be removed by dry or wet etching using techniques which are selective for removing the blocking layer 38 without significantly etching the gate layer 36 or the metal silicide 50 in the gate area. Such processes include the use of hydrofluoric acid or fluorine based plasma etching.

A dry etch process is preferably used to further define the gate 44 by removing the exposed gate layer 36 surrounding the gate area 44. A dry etch process using a plasma of one or more of a halogen, oxygen, and a polymerizing material is preferably used. During the etching process, the metal silicide 50 is preferably substantially unaffected by the etching chemicals and thus provides a hard mask for the gate layer 36 underlying the metal silicide as shown in FIG. 11. Some of the metal silicide 50 may be etched so the metal silicide 50 is preferably thick enough to withstand removal of the entire gate layer 36 surrounding the gate area 44 without removing all of the metal silicide 50. Etching the gate layer 36 thus exposes the oxide layer 34 surrounding the gate area 44.

The resulting structure is processed to complete the fabrication of the integrated circuit, such as by forming source drain regions 54 adjacent the gate area 44 by ion implantation, as depicted in FIG. 12. Preferably, a salicidation of the source drain areas 54 and gate area 44 is performed, as shown in FIG. 13. The salicidation process provides silicided areas 62, and also tends to increase the thickness of the metal silicide 50 in the gate area 44. A self aligned semiconductor gate according to the invention is illustrated in FIG. 13.

It is appreciated that there are many steps that are required to accomplish the processing as described above, and that some intermediate steps, such as patterning and stripping steps, have been omitted. However, those steps which are not completely described above are preferably accomplished according to the processes that are known to be compatible with the materials and processes as described above. Those steps which are not fully described herein have been omitted so as to not unnecessarily encumber this description of the more relevant portions of the invention.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for making a gate in an integrated circuit, the method comprising the steps of:
    forming a gate layer on a substrate,
    forming a blocking layer on the gate layer,
    masking the blocking layer with a negative photoresist layer and exposing the negative photoresist layer using a positive photoresist mask, where the positive photoresist mask is typically used to expose a positive photoresist layer prior to a gate etch process,
    developing the photoresist layer to define an exposed gate area,
    etching the blocking layer in the gate area to expose the gate layer in the gate area,
    removing the photoresist layer,
    forming a metal layer on the blocking layer and on the gate layer in the gate area,
    selectively reacting the metal layer with the gate layer in the gate area to form a hard mask over the gate layer in the gate area,
    removing the metal layer from the blocking layer,
    selectively etching the blocking layer without substantially etching the hard mask in the gate area, to expose the gate layer surrounding the gate area, and
    etching the exposed gate layer to define a gate in the gate area,
    where the hard mask remains on the gate and functions as an electrical contact to the gate.

2. The method of claim 1 further comprising forming an anti-reflective layer on the blocking layer prior to masking the blocking layer with a photoresist layer.

3. The method of claim 1 wherein the gate layer comprises polysilicon.

4. The method of claim 1 wherein the metal layer comprises at least one of titanium, tungsten, nickel and cobalt.

5. The method of claim 1 wherein the blocking layer comprises at least one of silicon oxide, silicon nitride, and silicon oxy nitride.

6. The method of claim 1 wherein the hard mask comprises silicide.

7. The method of claim 1 further comprising the additional step of defining source drain areas adjacent the gate area using ion implantation to self align the gate area with the integrated circuit.

8. The method of claim 1 wherein the substrate further comprises a gate dielectric layer on top of a semiconducting substrate.

9. The method of claim 1 wherein the step of forming the blocking layer further comprises oxidizing the gate layer.

10. The method of claim 1 wherein the gate layer has a thickness ranging from about five hundred angstroms to about twenty-five hundred angstroms.

11. The method of claim 1 wherein the blocking layer has a thickness ranging from about twenty angstroms to about two hundred angstroms.

12. An integrated circuit, the improvement comprising a gate made by the method of claim 1.

13. A method for making a polysilicon gate in an integrated circuit, the method comprising the steps of:
    forming a silicon oxide gate layer on a semiconducting substrate,
    forming a polysilicon gate layer on the gate layer,
    oxidizing the gate layer to form a silicon oxide blocking layer on the gate layer,
    masking the blocking layer with a negative photoresist layer and exposing the negative photoresist layer using a positive photoresist mask, where the positive photoresist mask is typically used to expose a positive photoresist layer prior to a gate etch process,
    developing the photoresist layer to define an exposed gate area,
    etching the blocking layer in the gate area to expose the gate layer in the gate area,
    removing the photoresist layer,
    forming a metal layer on the blocking layer and on the gate layer in the gate area,
    selectively reacting the metal layer with the gate layer in the gate area to form a silicide hard mask over the gate layer in the gate area,
    removing the metal layer from the blocking layer,
    selectively etching the blocking layer without substantially etching the hard mask in the gate area, to expose the gate layer surrounding the gate area, and
    etching the exposed gate layer to define a gate in the gate area,
    where the hard mask remains on the gate and functions as an electrical contact to the gate.

14. The method of claim 13 further comprising forming an anti-reflective layer on the blocking layer prior to masking the blocking layer with a photoresist layer.

15. The method of claim 13 wherein the metal layer comprises at least one of titanium, tungsten, nickel and cobalt.

16. The method of claim 13 further comprising the additional step of defining source drain areas adjacent the gate area using ion implantation to self align the gate area with the integrated circuit.

17. An integrated circuit, the improvement comprising a gate made by the method of claim 13.

18. A method for making a polysilicon gate in an integrated circuit, the method comprising the steps of:

forming a silicon oxide gate layer on a semiconducting substrate, forming a polysilicon gate layer on the gate layer, oxidizing the gate layer to form a silicon oxide blocking layer on the gate layer, forming an anti-reflective layer on the blocking layer, masking the anti-reflective layer with a negative photoresist layer and exposing the negative photoresist layer using a positive photoresist mask, where the positive photoresist mask is typically used to expose a positive photoresist layer prior to a gate etch process, developing the photoresist layer to define an exposed gate area, etching the anti-reflective layer and the blocking layer in the gate area to expose the gate layer in the gate area, removing the photoresist layer, removing the anti-reflective layer, forming a metal layer on the blocking layer and on the gate layer in the gate area, selectively reacting the metal layer with the gate layer in the gate area to form a silicide hard mask over the gate layer in the gate area, removing the metal layer from the blocking layer, selectively etching the blocking layer without substantially etching the hard mask in the gate area, to expose the gate layer surrounding the gate area, etching the exposed gate layer to define a gate in the gate area, where the hard mask remains on the gate and functions as an electrical contact to the gate, and defining source drain areas adjacent the gate using ion implantation to self align the gate with the integrated circuit.

\* \* \* \* \*